(12) United States Patent
Winnicka et al.

(10) Patent No.: US 10,100,438 B2
(45) Date of Patent: Oct. 16, 2018

(54) METALLIC CRUCIBLES AND METHODS OF FORMING THE SAME

(71) Applicants: Maria Bozena Winnicka, Euclid, OH (US); Gary A. Rozak, Akron, OH (US)

(72) Inventors: Maria Bozena Winnicka, Euclid, OH (US); Gary A. Rozak, Akron, OH (US)

(73) Assignee: H.C. STARCK INC., Newton, MA (US)

( * ) Notice: Subject to any disclaimer, the term of this patent is extended or adjusted under 35 U.S.C. 154(b) by 20 days.

(21) Appl. No.: 15/254,576

(22) Filed: Sep. 1, 2016

(65) Prior Publication Data

US 2016/0368058 A1 Dec. 22, 2016

Related U.S. Application Data

(63) Continuation of application No. 13/799,796, filed on Mar. 13, 2013, now Pat. No. 9,457,405.

(Continued)

(51) Int. Cl.
| | |
|---|---|
| *C30B 35/00* | (2006.01) |
| *B22F 5/10* | (2006.01) |
| *C30B 11/00* | (2006.01) |
| *C30B 15/10* | (2006.01) |
| *B22F 3/00* | (2006.01) |

(Continued)

(52) U.S. Cl.
CPC ............ *C30B 35/002* (2013.01); *B22F 3/001* (2013.01); *B22F 3/04* (2013.01); *B22F 3/1007* (2013.01); *B22F 3/1017* (2013.01); *B22F 3/16* (2013.01); *B22F 3/24* (2013.01); *B22F 5/00* (2013.01); *B22F 5/10* (2013.01); *B22F 7/008* (2013.01); *B22F 7/06* (2013.01); *C30B 11/002* (2013.01); *C30B 15/10* (2013.01); *C30B 29/20* (2013.01); *B22F 2003/248* (2013.01); *B22F 2201/013* (2013.01); *B22F 2301/20* (2013.01); *B22F 2302/45* (2013.01); *B22F 2998/10* (2013.01); *B22F 2999/00* (2013.01); *Y10T 117/1024* (2015.01)

(58) Field of Classification Search
None
See application file for complete search history.

(56) References Cited

U.S. PATENT DOCUMENTS

| | | |
|---|---|---|
| 2,984,807 A | 5/1961 | Blum |
| 3,185,566 A | 5/1965 | Philippe |

(Continued)

FOREIGN PATENT DOCUMENTS

| | | |
|---|---|---|
| GB | 707653 A | 4/1954 |
| GB | 2142935 A | 1/1985 |

(Continued)

OTHER PUBLICATIONS

Elena R. Dobrovinskaya, Leonid A. Lytvynov, Valerian Pishchik, Sapphire Materials, Manufacturing, Applications, Apr. 21, 2009, Springer Science & Business Media, pp. 237-239.*

(Continued)

*Primary Examiner* — Erin F Bergner
(74) *Attorney, Agent, or Firm* — Morgan, Lewis & Bockius LLP

(57) ABSTRACT

In various embodiments, a precursor powder is pressed into an intermediate volume and chemically reduced, via sintering, to form a metallic shaped article.

22 Claims, 2 Drawing Sheets

Related U.S. Application Data

(60) Provisional application No. 61/652,393, filed on May 29, 2012.

(51) Int. Cl.

| | | |
|---|---|---|
| *B22F 3/04* | (2006.01) | |
| *B22F 3/10* | (2006.01) | |
| *B22F 5/00* | (2006.01) | |
| *B22F 7/06* | (2006.01) | |
| *C30B 29/20* | (2006.01) | |
| *B22F 3/16* | (2006.01) | |
| *B22F 3/24* | (2006.01) | |
| *B22F 7/00* | (2006.01) | |

(56) References Cited

U.S. PATENT DOCUMENTS

| | | | |
|---|---|---|---|
| 3,390,013 | A | 6/1968 | Rubisch |
| 3,572,992 | A | 3/1971 | Komeya et al. |
| 3,764,286 | A | 10/1973 | Antczak et al. |
| 5,993,731 | A | 11/1999 | Jech et al. |
| 6,422,861 | B1 | 7/2002 | Antczak et al. |
| 6,632,086 | B1 | 10/2003 | Antczak et al. |
| 7,363,776 | B2 | 4/2008 | Zeng et al. |
| 8,088,232 | B2 | 1/2012 | Lemon et al. |
| 2004/0067152 | A1 | 4/2004 | Kochanek |
| 2005/0034562 | A1 | 2/2005 | Singh et al. |
| 2005/0199012 | A9 | 9/2005 | Giddings et al. |
| 2006/0086205 | A1 | 4/2006 | Johnson et al. |
| 2006/0165572 | A1 | 7/2006 | McHugh et al. |
| 2006/0204395 | A1 | 9/2006 | Johnson |
| 2008/0118422 | A1 | 5/2008 | Amelunxen et al. |
| 2008/0124269 | A1 | 5/2008 | Daudey et al. |
| 2008/0166280 | A1 | 7/2008 | Daudey et al. |
| 2008/0213122 | A1 | 9/2008 | Johnson et al. |
| 2009/0029852 | A1 | 1/2009 | Hagemeyer |
| 2009/0095131 | A1 | 4/2009 | Johnson, Jr. et al. |
| 2009/0098010 | A1 | 4/2009 | Johnson, Jr. et al. |
| 2009/0116995 | A1 | 5/2009 | Johnson, Jr. et al. |
| 2009/0286678 | A1 | 11/2009 | Hagemeyer |
| 2010/0139550 | A1 | 6/2010 | Aichele et al. |
| 2011/0014097 | A1 | 1/2011 | Amelunxen et al. |
| 2011/0223054 | A1 | 9/2011 | Gries |
| 2013/0023699 | A1 | 1/2013 | Macht et al. |
| 2013/0239882 | A1* | 9/2013 | Bramhall, Jr. .......... C23C 16/18 117/223 |
| 2015/0225870 | A1* | 8/2015 | Katoh .................. C30B 11/002 117/223 |

FOREIGN PATENT DOCUMENTS

| | | |
|---|---|---|
| JP | 6025855 A | 2/1994 |
| JP | 2001-323302 A | 11/2001 |
| JP | 2011-68983 | 4/2011 |
| JP | 2011127150 A | 6/2011 |
| WO | 1999056899 A1 | 11/1999 |
| WO | 2000076698 A1 | 12/2000 |
| WO | 2013180965 A2 | 12/2013 |

OTHER PUBLICATIONS

International Application Serial No. PCT/US2013/041347, Invitation to Pay Additional Fees and Partial Search Report dated Oct. 21, 2013, 6 pages.

International Application Serial No. PCT/US2013/041347, International Search Report and Written Opinion dated Mar. 24, 2014, 11 pages.

\* cited by examiner

METALLIC CRUCIBLES AND METHODS OF FORMING THE SAME

RELATED APPLICATIONS

This application is a continuation of U.S. patent application Ser. No. 13/799,796, filed Mar. 13, 2013, which claims the benefit of and priority to U.S. Provisional Patent Application No. 61/652,393, filed May 29, 2012, the entire disclosure of each of which is hereby incorporated herein by reference.

TECHNICAL FIELD

In various embodiments, the present invention relates to the formation of crucibles and other shaped articles, in particular utilizing powder metallurgy techniques.

BACKGROUND

Molybdenum (Mo) crucibles find widespread use in the production of sapphire single crystals due to their beneficial refractory properties, including a high melting point. Most Mo crucibles are fabricated either by the deep drawing of Mo sheets or via powder metallurgy techniques utilizing high-purity Mo powder. However, such techniques are often difficult and expensive to implement. For example, the powder metallurgy of Mo typically requires expensive, high-purity Mo powder. Furthermore, the powder-metallurgy processing of Mo powder generally results in Mo crucibles with densities less than 100%, which may compromise the mechanical properties (e.g., toughness) of such crucibles.

Furthermore, while Mo crucibles may be suitable for many sapphire fabrication processes, pure Mo tends to have a relatively high vapor pressure, which may result in contamination as the sapphire is grown from the liquid melt. While crucibles made of tungsten (W) or even uniform Mo—W alloys (e.g., formed by powder metallurgy of mixed Mo and W powders) can alleviate some of the issues arising from the use of pure Mo crucibles, such crucibles tend to be heavy (and thus difficult to handle), quite expensive, and generally have lower toughness (particularly in the case of pure W).

In view of the foregoing, there is a need for techniques not only for the more efficient production of refractory metal (e.g., Mo) crucibles, but also for crucibles incorporating the advantageous properties of refractory metal alloys (e.g., Mo—W alloys) without the above-described disadvantages.

SUMMARY

In accordance with various embodiments of the present invention, crucibles or other shaped articles based on, e.g., Mo or a Mo—W alloy, are formed via powder metallurgy techniques, and such articles have superior properties (e.g., weight, toughness, grain size) compared to conventional Mo crucibles. Crucibles fabricated in accordance with embodiments of the invention may be advantageously utilized in the production of sapphire single crystals with low levels of contamination, and such crucibles are also more mechanically robust and less expensive to fabricate. The present description will typically make reference to crucibles as the articles of manufacture according to embodiments of the invention, but it is understood that the techniques and materials disclosed herein may be utilized to make many different types of shaped articles (e.g., wires, tubes, seamless tubes, plates, sheets, etc.). Moreover, while the present disclosure describes Mo-based articles and powders in exemplary embodiments, the techniques utilized herein may also be advantageously utilized with other materials, e.g., other refractory metals. As utilized herein, the term "shaped article" refers to bulk three-dimensional objects (as opposed to mere grains of powder) with shapes as simple as a slab but also more complex shapes such as crucibles and other volumes having convexity and/or concavity. For complex shapes, the final shape (not considering any process-related shrinkage) is typically formed by molding as opposed to bulk compression followed by machining.

Embodiments of the invention press and sinter metallic precursor powders (e.g., Mo precursor powder) rather than the corresponding pure metal powders, and the precursor powder is reduced into one or more pure metals (e.g., Mo and/or W) in situ during the sintering process. As utilized herein, the term "precursor" refers to a compound of one or more metals with, e.g., oxygen, ammonium, and/or other elements or species (e.g., non-metallic elements or species), that, when chemically reduced (e.g., exposed to a reducing atmosphere such as a hydrogen-containing gas, particularly at elevated temperatures) reacts to form the one or more metals in their substantially pure form (while evolving by-products such as, e.g., water vapor, oxygen, ammonia, etc.). During the in situ reduction process, crystal grains nucleate from a multitude of different locations along and within the body of the shaped article, resulting in an advantageously smaller grain size in the completed shaped article. For example, crucibles fabricated in accordance with various embodiments hereof have a grain size at least four times smaller than that of a conventional crucible (e.g., a conventional Mo crucible) formed via powder metallurgy. One example of a Mo-precursor powder advantageously utilized in embodiments of the present invention is ammonium dimolybdate (ADM). Other examples include molybdenum dioxide and Mo-precursor powders that contain nitrogen, hydrogen, and oxygen such as ammonium molybdates, e.g., ammonium paramolybdate and/or ammonium orthomolybdate. Examples of W-precursor powders advantageously utilized in embodiments of the present invention are ammonium tungstates such as ammonium paratungstate and/or ammonium metatungstate.

In various embodiments, precursor powders of multiple metals (e.g., Mo and W) may be mixed together prior to pressing and sintering (and the resulting chemical reduction), resulting in final shaped articles including or consisting essentially of an alloy or mixture of the metals. The relative concentrations of the metals within the alloy or mixture may be determined at least in part on the various amounts of the different precursor powders initially mixed together.

Additionally, crucibles and other shaped articles formed in accordance with various embodiments of the present invention have elevated porosities that are advantageously utilized for the incorporation of additives (e.g., metals forming alloys and/or mixtures with a Mo matrix) therewithin. For example, in an embodiment a Mo crucible has a density of only 95% or less, e.g., ranging from approximately 90% to approximately 95%, or even from approximately 90% to approximately 92%, after the in situ sintering of a Mo-precursor powder. One or more additives (typically metals such as W, copper (Cu), etc.) may be introduced on one or more surfaces of such articles by, e.g., sprinkling and/or thermal spray techniques (such as plasma spray, cold spray, kinetic spray, and the like). The treated articles may be subsequently treated (e.g., with additional sintering) to alloy and/or mix the additive with the metallic matrix of the crucible to improve one or more properties (e.g., electrical conductivity, vapor pressure, toughness) of the article.

In an aspect, embodiments of the invention feature a method of fabricating a shaped article having a target set of final dimensions and consisting essentially of at least one metal. A precursor powder is pressed into a volume having intermediate dimensions larger than the final dimensions along at least one direction. The precursor powder includes or consists essentially of (i) the at least one metal and (ii) a non-metallic chemical species. Thereafter, the pressed precursor powder is sintered to (i) chemically reduce the precursor powder, (ii) shrink the volume having intermediate dimensions into the shaped article having the final dimensions, and (iii) release a non-metallic by-product.

Embodiments of the invention may include one or more of the following in any of a variety of different combinations. The non-metallic species may include or consist essentially of oxygen and/or ammonium. The at least one metal may include or consist essentially of molybdenum. The precursor powder may include or consist essentially of ammonium dimolybdate. The volume shrinkage from the intermediate dimensions to the final dimensions may be within the range of approximately 50% to approximately 70%. The precursor powder may be pressed by cold isostatic pressing. Sintering the pressed precursor powder may include or consist essentially of a plurality of heating stages each at a different maximum temperature. Each of at least two (or even at least three) of the heating stages may include or consist essentially of chemical reduction of the pressed powder to a different intermediate product. The shaped article may have a density ranging between approximately 90% and approximately 95% after sintering. The sintering may be performed in an atmosphere including or consisting essentially of hydrogen. The shaped article may include or consist essentially of a crucible. The by-product may include or consist essentially of ammonia, oxygen, and/or water vapor.

Sintering the pressed precursor powder may include or consist essentially of sintering at a first temperature less than approximately 1000° C. for at least 2 hours, and thereafter, sintering at a second temperature selected from the range of approximately 1450° C. to approximately 1800° C. for at least 6 hours. Sintering the pressed precursor powder may include or consist essentially of sintering at a first temperature selected from the range of approximately 450° C. to approximately 650° C. for a first time selected from the range of approximately 4 hours to approximately 6 hours, thereafter, sintering at a second temperature selected from the range of approximately 500° C. to approximately 700° C. for a second time selected from the range of approximately 5 hours to approximately 7 hours, thereafter, sintering at a third temperature selected from the range of approximately 800° C. to approximately 1000° C. for a third time selected from the range of approximately 1 hour to approximately 5 hours, and thereafter, sintering at a fourth temperature selected from the range of approximately 1450° C. to approximately 1800° C. for a fourth time selected from the range of approximately 6 hours to approximately 25 hours. Sintering the pressed precursor powder may include or consist essentially of sintering at a first temperature selected from the range of approximately 450° C. to approximately 650° C. for a first time selected from the range of approximately 4 hours to approximately 6 hours, thereafter, sintering at a second temperature greater than the first temperature and less than approximately 700° C. for a second time selected from the range of approximately 5 hours to approximately 7 hours, thereafter, sintering at a third temperature greater than the second temperature and less than approximately 1000° C. for a third time selected from the range of approximately 1 hour to approximately 5 hours, and thereafter, sintering at a fourth temperature greater than the third temperature and less than approximately 1800° C. for a fourth time selected from the range of approximately 6 hours to approximately 25 hours.

The pressed precursor powder may be sintered at a first temperature. After sintering the pressed precursor powder, the shaped article may be cooled to a second temperature less than the first temperature and greater than 100° C. The shaped article may be held at the second temperature (i) for a first time selected from the range of approximately 1 hour to approximately 8 hours and (ii) within an ambient including or consisting essentially of hydrogen. After the shaped article is held at the second temperature for the first time, the shaped article may be held at a third temperature less than the first temperature and greater than 100° C. (i) for a second time selected from the range of approximately 1 hour to approximately 8 hours and (ii) within an ambient including or consisting essentially of nitrogen. The second temperature may be approximately equal to the third temperature. An additive may be disposed on at least one surface of the shaped article. The shaped article may be annealed, thereby alloying and/or mixing the additive with the at least one metal to form a treated article. The at least one surface of the treated article may include or consist essentially of an alloy of the at least one metal and the additive. The concentration of the additive may vary (e.g., may be graded) as a function of thickness of the treated article. A portion of a thickness of the treated article may be substantially free of the additive. The grain size of the treated article may be approximately equal to the grain size of the shaped article. The additive may include or consist essentially of tungsten and/or copper. The additive may be a powder. Disposing the additive may include or consist essentially of sprinkling, applying a slurry, and/or spray deposition (e.g., cold spray).

In another aspect, embodiments of the invention feature a method of fabricating a shaped article having a target set of final dimensions and consisting essentially of molybdenum. An ammonium-based molybdenum-precursor powder is pressed into a volume having intermediate dimensions larger than the final dimensions along at least one direction. Thereafter, the pressed powder is sintered to chemically reduce the precursor powder and shrink the volume having intermediate dimensions into the shaped article having the final dimensions. Sintering the pressed powder includes or consists essentially of sintering at a first temperature selected from the range of approximately 450° C. to approximately 650° C. for a first time selected from the range of approximately 4 hours to approximately 6 hours, thereafter, sintering at a second temperature greater than the first temperature and less than approximately 700° C. for a second time selected from the range of approximately 5 hours to approximately 7 hours, thereafter, sintering at a third temperature greater than the second temperature and less than approximately 1000° C. for a third time selected from the range of approximately 1 hour to approximately 5 hours, and thereafter, sintering at a fourth temperature greater than the third temperature and less than approximately 1800° C. for a fourth time selected from the range of approximately 6 hours to approximately 25 hours. The ammonium-based molybdenum-precursor powder may include or consist essentially of ammonium dimolybdate.

In yet another aspect, embodiments of the invention feature a method of fabricating a shaped article having a target set of final dimensions and consisting essentially of molybdenum. Ammonium dimolybdate powder is pressed into a volume having intermediate dimensions larger than the final dimensions along at least one direction. Thereafter, the pressed powder is sintered to chemically reduce the precursor powder and shrink the volume having intermediate dimensions into the shaped article having the final dimensions. Sintering the pressed powder includes or consists essentially of sintering at a first temperature to chemically reduce ammonium dimolybdate to molybdenum trioxide, thereafter, sintering at a second temperature to chemically reduce molybdenum trioxide to molybdenum dioxide, thereafter, sintering at a third temperature to chemically reduce molybdenum dioxide to molybdenum, and thereafter, sintering at a fourth temperature to densify molybdenum, thereby forming the shaped article.

Embodiments of the invention may include one or more of the following in any of a variety of different combinations. The fourth temperature may be greater than the third temperature. The third temperature may be greater than the second temperature. The second temperature may be greater than the first temperature. The first temperature may be selected from the range of approximately 100° C. to approximately 650° C. The first temperature may be selected from the range of approximately 450° C. to approximately 650° C. The second temperature may be selected from the range of approximately 500° C. to approximately 700° C. The third temperature may be selected from the range of approximately 800° C. to approximately 1000° C. The fourth temperature may be selected from the range of approximately 1450° C. to approximately 1800° C. Sintering at the first temperature may be performed for a first time selected from the range of approximately 4 hours to approximately 6 hours. Sintering at the second temperature may be performed for a second time selected from the range of approximately 5 hours to approximately 7 hours. Sintering at the third temperature may be performed for a third time selected from the range of approximately 1 hour to approximately 5 hours. Sintering at the fourth temperature may be performed for a fourth time selected from the range of approximately 6 hours to approximately 25 hours.

In a further aspect, embodiments of the invention feature a method of treating a shaped article. An additive is disposed on at least one surface of a shaped article including or consisting essentially of one or more metals. The shaped article has a density less than approximately 95%. The shaped article is annealed, thereby alloying and/or mixing the additive with the metal to form a treated article including or consisting essentially of (i) an inner layer including or consisting essentially of an alloy or mixture of the additive and the metal, (ii) an outer layer consisting essentially of the metal, and (iii) therebetween, a zone including or consisting essentially of a graded concentration of the alloy or mixture of the additive and the metal.

In yet a further aspect, embodiments of the invention feature a crucible that includes or consists essentially of an inner layer consisting essentially of an alloy of molybdenum and tungsten, an outer layer consisting essentially of molybdenum, and therebetween, a zone consisting essentially of a graded concentration of molybdenum and tungsten.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the term "cold spray" refers to techniques in which one or more powders are spray-deposited without melting during spraying, e.g., cold spray, kinetic spray, and the like. The sprayed powders may be heated prior to and during deposition, but only to temperatures below their melting points. As used herein, the terms "approximately" and "substantially" mean ±10%, and in some embodiments, ±5%. The term "consists essentially of" means excluding other materials that contribute to function, unless otherwise defined herein. Nonetheless, such other materials may be present, collectively or individually, in trace amounts. As used herein, "consisting essentially of at least one metal" refers to a metal or a mixture of two or more metals but not compounds between a metal and a non-metallic element or chemical species such as oxygen or nitrogen (e.g., metal nitrides or metal oxides); such non-metallic elements or chemical species may be present, collectively or individually, in trace amounts, e.g., as impurities.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
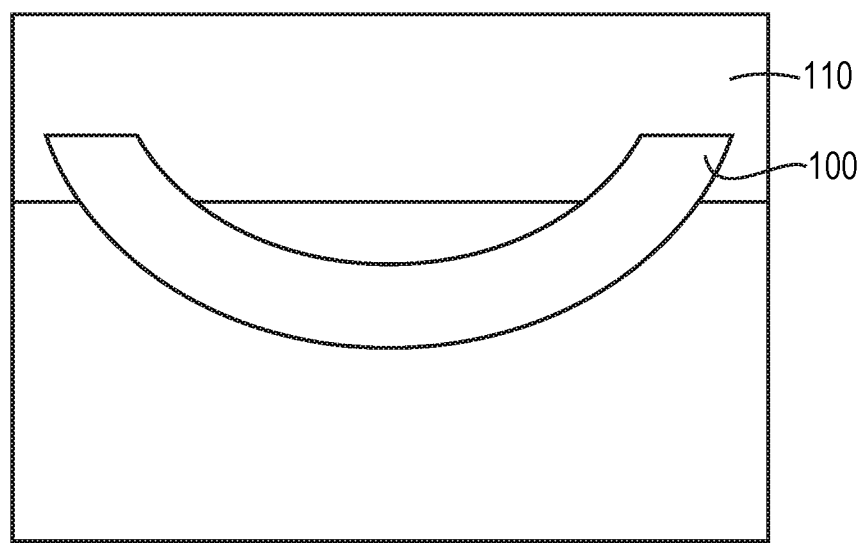
FIG. 1 is a schematic cross-section of shaped precursor powder pressed in a mold in accordance with various embodiments of the invention.

Referring to the cross-section depicted in FIG. 1, in accordance with various embodiments of the present invention, grains of one or more metal-precursor powders 100 are collected and pressed into a desired shape (e.g., the cup-like shape of a crucible). For example, the precursor powder 100 may be cold-isostatically pressed within a mold 110. During cold-isostatic pressing, the mold 110 is typically flexible, and fluid pressure (at a level of, e.g., 15,000 psi to 40,000 psi) is applied to the mold at approximately room temperature to press the precursor powder 100 into the molded shape. The precursor powder 100 typically includes or consists essentially of, e.g., a compound of one or more metals (e.g., refractory metals such as Mo and/or W), oxygen, and/or other elements. The shape into which precursor powder 100 is formed, which generally corresponds to the inner shape defined by mold 110, has a size that is typically larger than that desired for the finished article, as embodiments of the present invention take into account shrinkage of the pressed powder during the sintering and in situ reduction described in more detail below. Such shrinkage may be greater than in conventional processes in which already-reduced metal powder is shaped into a shaped article, as the in situ reduction generally involves the production and elimination of non-solid by-products (e.g., water vapor, ammonia) during the process. For example, when precursor powder 100 includes or consists essentially of ADM (and/or one or more other molybdenum precursors), such shrinkage may range between approximately 50% (or even 60%) and approximately 70%, e.g., approximately 67%. Such shrinkage would, in many cases, be expected to compromise the integrity and/or mechanical properties of the final article via, e.g., introduction of defects or cracking; embodiments of the present invention unexpectedly result in final sintered articles shrunk to a desired shape without mechanical instability.

Figure 2:
FIG. 2 is a schematic cross-section of a sintered shaped article in accordance with various embodiments of the invention.

After pressing, the pressed precursor powder 100 is sintered to both reduce the precursor powder 100 into substantially pure metal (e.g., Mo) or an alloy or mixture of substantially pure metals (e.g., Mo—W) and fuse the resulting metal particulates into a solid article. In an exemplary embodiment of the invention, the pressed precursor powder 100 is sintered in a multiple-step process in a reducing atmosphere, e.g., hydrogen gas. For example, in embodiments in which precursor powder 100 includes or consists essentially of ADM, the following multiple-step sintering process may be performed in a furnace and in a hydrogen atmosphere. The pressed powder 100 may first be ramped to approximately 550° C. over, e.g., 30 minutes, and then held at approximately 550° C. for, e.g., 5 hours, during which the ADM is reduced into Mo trioxide. During this step, water vapor and ammonia form as by-products and are removed from the furnace via, e.g., a burning stack in the presence of hydrogen. The temperature may then be raised to approximately 600° C. over, e.g., 30 minutes, and then held at approximately 600° C. for, e.g., 6 hours. During this portion of the cycle, the Mo trioxide is reduced to Mo dioxide, and water vapor formed as a by-product is again exhausted. The temperature may then be ramped to approximately 900° C. over, e.g., 3 hours, and then held at approximately 900° C. for, e.g., 2 hours, during which time the Mo dioxide is reduced to substantially pure Mo and by-product water vapor is exhausted from the furnace. The temperature of the furnace may subsequently be raised to a temperature ranging between approximately 1450° C. and approximately 1800° C. over, e.g., 12-15 hours, at which point the substantially pure Mo is sintered at the selected temperature for, e.g., 10 hours. As shown in the cross-sectional view of FIG. 2, the pressed precursor powder 100 has been converted into the substantially pure Mo article 200, the size of which has shrunk (as detailed above) during the in situ reduction process. Furthermore, the grain size of article 200 is generally quite small (for example, ranging between 5 and 20 microns, e.g., between 10 and 15 microns, compared with the 40-50 micron grain size resulting from conventional techniques) due to the multiplicity of Mo nucleation sites during the in situ reduction process.

After the sintering at the final elevated temperature, the article 200 may undergo a controlled cool-down cycle. For example, the temperature of the furnace may be ramped back down to approximately 500° C. over, e.g., 30 minutes, and held at approximately 500° C. for, e.g., 5 hours. Thereafter, the atmosphere within the furnace may be changed from hydrogen to one including or consisting essentially of nitrogen for additional dwell time (e.g., approximately 4 hours at approximately 500° C.) and the final cool-down to room temperature. In some embodiments of the present invention, following cool-down the article 200 is itself utilized as a crucible for any of a variety of purposes, e.g., production of sapphire single crystals. As described above, at this stage the article 200 may be fairly porous. For example, the density of article 200 may be between approximately 90% and approximately 95%. Such density may be increased if desired by subjecting article 200 to more aggressive (e.g., higher temperature and/or longer time) sintering during the above-described process and/or in a subsequent sintering process (utilizing, for example, hot isostatic pressing). After such additional treatment, the density of the treated article 200 may be between approximately 97% and approximately 99%.

Figure 3:
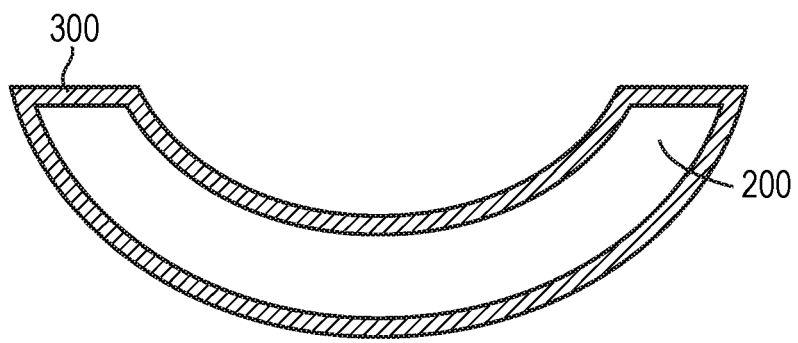
FIG. 3 is a schematic cross-section of a shaped article having an additive applied thereon in accordance with various embodiments of the invention.

In other embodiments of the invention, article 200 is merely a "pre-crucible" or "pre-article" that is further processed for the improvement of various properties thereof. For example, as depicted in the cross-sectional view of FIG. 3, an additive 300 may be deposited on one or more surfaces (e.g., the inner surface and/or the outer surface) of the article 200. The additive 300 preferably includes or consists essentially of one or more metallic materials (such as W or Cu). The additive 300 may be physically placed on article 200 by, e.g., sprinkling, and/or may be sprayed thereon by, e.g., thermal spray techniques such as plasma spray, cold spray, or kinetic spray. The additive 300 may be in the form of a powder and may have a particle size of, e.g., 5 microns or less. When considered in the aggregate with the bulk of the article 200, the additive 300 may be introduced to a level between approximately 5% and approximately 20% by weight. Such powder may be mixed with a liquid, thereby forming a slurry, to facilitate introduction thereof onto article 200. For additives 300 in powder form, a vibratory stage may be utilized to facilitate full and even coverage on article 200. The relatively high porosity of article 200 advantageously enables the incorporation (and/or alloying and/or mixing) of the additive 300 into the metallic (e.g., Mo) matrix of article 200, as mentioned previously. After introduction of the additive 300, the treated article 200 is preferably sintered to react additive 300 with the metallic matrix of article 200 and/or diffuse the additive 300 into the article 200 matrix. For example, the treated article 200 (having additive 300 on one or more surfaces thereof) may be sintered at, e.g., approximately 2000° C. for, e.g., approximately 2 hours in a hydrogen atmosphere, particularly for a refractory additive such as W. In some embodiments in which the additive 300 is a material having a lower melting point, e.g., Cu, the treated article 200 may be sintered at, e.g., a temperature between approximately 700° C. and approximately 900° C. In some embodiments, the treated article 200 is hot isostatically pressed to incorporate additive 300 therewithin. After sintering the resulting article may substantially maintain the advantageously small grain size of article 200. In some embodiments, the treated article 200 is sintered at a first, lower temperature (e.g., a temperature between approximately 800° C. and approximately 1200° C.) such that the additive 300 at least primarily diffuses within article 200, and then, after such diffusion, is sintered at a second, higher temperature (e.g., a temperature of approximately 2000° C. or higher, for example between approximately 2000° C. and approximately 2600° C.) such that the additive 300 reacts (e.g., alloys) with the matrix of article 200.

Figure 4:
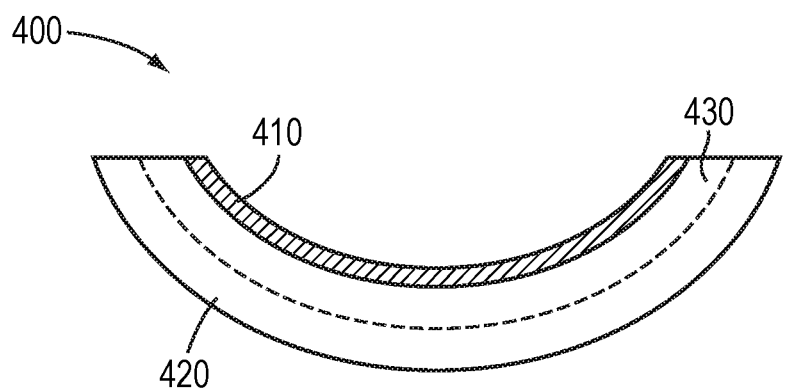
FIG. 4 is a schematic cross-section of the shaped article of FIG. 3 after thermal treatment in accordance with various embodiments of the invention.
Figure 5:
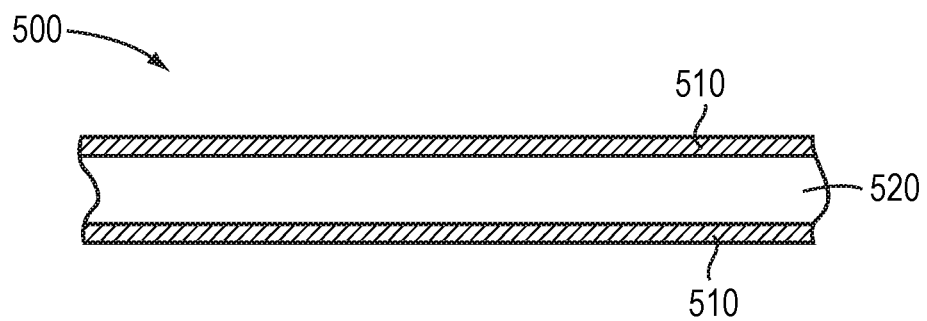
FIG. 5 is a schematic cross-section of a shaped article incorporating an additive in accordance with various embodiments of the invention.

As shown in the cross-sectional views of FIGS. 4 and 5, crucibles and other articles having improved properties (e.g., mechanical, thermal, and/or electrical) may be fabricated in accordance with embodiments of the present invention. FIG. 4 depicts a crucible 400 having multiple regions each having different material concentrations and/or mechanical properties. Crucible 400 may be formed via the deposition of W powder (as the additive 300) on the inner surface of a Mo pre-crucible, followed by sintering at a high temperature (e.g., approximately 2000° C. or higher) as described above. As shown, crucible 400 features an inner layer 410 that includes or consists essentially of Mo—W alloy formed by the reaction of the Mo pre-crucible with the W powder. The crucible 400 also features an outer layer 420 that typically includes or consists essentially of substantially pure Mo, as introduction of W throughout the entire crucible 400 may increase its weight or have other deleterious effects. Between layer 410 and 420 is a zone 430 that includes or consists essentially of both the Mo of the pre-crucible and the W of the additive (which may be alloyed and/or mixed together at any of a range of concentrations of the constituent elements). In one embodiment, the concentration of W (or other additive 300) is graded through the thickness of zone 430 from a larger value (e.g., approximately the concentration of W within layer 410) at the interface with layer 410 to a smaller value (e.g., approximately zero) at the interface with layer 420. In some embodiments of the invention, the concentration of W (or other additive 300) is substantially linearly graded within zone 430. In other embodiments, the concentration of the additive 300 decreases with distance into the zone 430 (from the surface of the article 400) with an exponential dependence or in accordance with the complementary error function. In some embodiments layer 420 is substantially absent, and zone 430 extends from layer 410 to the outer surface of crucible 400, at which point the concentration of W is approximately zero or some finite value smaller than the concentration of W within zone 410.

Embodiments of the invention may be utilized to form articles other than crucibles. As shown in FIG. 5, an electrical contact (e.g., a wire) 500, treated as described above with an additive 300 including or consisting essentially of Cu, may have a layer or sheath 510 including or consisting essentially of a mixture of Mo and Cu at least partially surrounding a core 520 including or consisting essentially of Mo. The Cu within layer 510 may impart higher electrical conductivity to contact 500. As described for FIG. 4, the Cu within contact 500 may have a substantially graded concentration through at least a portion of the thickness of contact 500, and thus core 520 may incorporate finite amounts of Cu (or other additive 300).

While the articles of FIGS. 4 and 5 have been described as fabricated utilizing pre-crucibles as described above with regard to FIGS. 1 and 2, fabrication of such articles may utilize any suitable starting (yet preferably fairly porous) pre-crucible not produced via the in situ reduction of precursor powder.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A crucible comprising:
   an inner surface consisting essentially of (i) an alloy of molybdenum and tungsten or (ii) a mixture of molybdenum and tungsten;
   extending from the inner surface through only a portion of a thickness of the crucible, an interior zone consisting essentially of (i) an alloy of molybdenum and tungsten or (ii) a mixture of molybdenum and tungsten; and
   an outer surface, opposite the inner surface, consisting essentially of molybdenum.

2. The crucible of claim 1, wherein a tungsten concentration within the interior zone is graded such that the tungsten concentration decreases toward the outer surface of the crucible.

3. The crucible of claim 2, wherein the tungsten concentration within the interior zone is linearly graded.

4. The crucible of claim 2, wherein the tungsten concentration within the interior zone decreases toward the outer surface of the crucible with an exponential dependence.

5. The crucible of claim 2, wherein the tungsten concentration within the interior zone decreases toward the outer surface of the crucible in accordance with the complementary error function.

6. The crucible of claim 1, wherein a total tungsten content within an entirety of the crucible is between approximately 5% and approximately 20% by weight.

7. A method of fabricating a crucible having a target set of final dimensions, the method comprising: pressing a precursor powder into a volume having intermediate dimensions larger than the final dimensions along at least one direction, the precursor powder comprising a compound comprising (i) molybdenum and (ii) a non-metallic chemical species; thereafter, sintering the pressed precursor powder to (i) chemically reduce the precursor powder, (ii) shrink the volume having intermediate dimensions into the crucible having the final dimensions, and (iii) release a non-metallic by-product; cooling the crucible; after cooling the crucible, disposing tungsten on at least one surface of the crucible; and annealing the crucible, thereby at least one of alloying or mixing the tungsten with the molybdenum to form the crucible comprising (i) an inner surface consisting essentially of (a)an alloy of molybdenum and tungsten or (b) a mixture of molybdenum and tungsten, (ii) an outer surface consisting essentially of molybdenum, and (iii) therebetween, an interior zone extending from the inner surface through only a portion of a thickness of the crucible and consisting essentially of (a) an alloy of molybdenum and tungsten or (b) a mixture of molybdenum and tungsten.

8. The method of claim 7, wherein after cooling and before annealing, the crucible has a density less than approximately 95%.

9. The method of claim 7, wherein annealing the crucible comprises: annealing the crucible at a first temperature to diffuse at least a portion of the tungsten into the crucible; and thereafter, annealing the crucible at a second temperature to alloy at least a portion of the tungsten with the molybdenum of the crucible.

10. The method of claim 9, wherein (i) the first temperature is selected from the range of approximately 800° C. to approximately 1200° C., and (ii) the second temperature is selected from the range of approximately 20000 and approximately 2600° C.

11. The method of claim 9, wherein (i) the first temperature is no greater than 1200° C. and (ii) the second temperature is no less than 2000° C.

12. The method of claim 7, wherein disposing the tungsten on at least one surface of the crucible comprises at least one of applying a slurry or spray deposition.

13. The method of claim 7, wherein the precursor powder comprises molybdenum dimolybdate.

14. The method of claim 13, wherein sintering the pressed powder comprises:
sintering at a first temperature to chemically reduce ammonium dimolybdate to molybdenum trioxide; thereafter, sintering at a second temperature to chemically reduce molybdenum trioxide to molybdenum dioxide; thereafter, sintering at a third temperature to chemically reduce molybdenum dioxide to molybdenum; and thereafter, sintering at a fourth temperature to densify molybdenum, thereby forming the crucible.

15. The method of claim 14, wherein (i) the fourth temperature is greater than the third temperature, (ii) the third temperature is greater than the second temperature, (iii) the second temperature is greater than the first temperature, and (iv) the first temperature is selected from the range of approximately 100° C. to approximately 650° C.

16. The method of claim 14, wherein (i) the first temperature is selected from the range of approximately 450° C. to approximately 650° C., (ii) the second temperature is selected from the range of approximately 500° C. to approximately 700° C., (iii) the third temperature is selected from the range of approximately 800° C. to approximately 1000° C., and (iv) the fourth temperature is selected from the range of approximately 1450° C. to approximately 1800° C.

17. The method of claim 7, wherein (i) the pressed precursor powder is sintered in an atmosphere consisting essentially of hydrogen, and (ii) the crucible is annealed in an atmosphere consisting essentially of hydrogen.

18. The method of claim 7, wherein the non-metallic by-product comprises ammonia.

19. The method of claim 7, wherein sintering the pressed precursor powder comprises: heating the pressed precursor powder at a first temperature to (i) chemically reduce the pressed precursor powder to an intermediate product comprising (a) molybdenum and (b) a second non-metallic chemical species, and (ii) release the non-metallic by-product; and thereafter, heating the intermediate product at a second temperature higher than the first temperature to (i) chemically reduce the intermediate product to molybdenum and (ii) release a second non-metallic by-product.

20. The method of claim 19, wherein the second non-metallic by-product and the non-metallic by-product are different.

21. The method of claim 19, wherein (i) the non-metallic by-product comprises ammonia and (ii) the second non-metallic by-product comprises water vapor.

22. The method of claim 7, wherein a tungsten concentration within the interior zone is graded such that the tungsten concentration decreases toward the outer surface of the crucible.

* * * * *